(12) United States Patent
Adachi et al.

(10) Patent No.: US 11,508,513 B2
(45) Date of Patent: Nov. 22, 2022

(54) COIL-EMBEDDED CERAMIC SUBSTRATE

(71) Applicant: Murata Manufacturing Co., Ltd., Nagaokakyo (JP)

(72) Inventors: Toshiro Adachi, Nagaokakyo (JP); Masataka Nakaniwa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 721 days.

(21) Appl. No.: 16/575,565

(22) Filed: Sep. 19, 2019

(65) Prior Publication Data

US 2020/0013538 A1 Jan. 9, 2020

Related U.S. Application Data

(63) Continuation of application No. PCT/JP2018/018092, filed on May 10, 2018.

(30) Foreign Application Priority Data

Jun. 5, 2017 (JP) .............................. JP2017-110871

(51) Int. Cl.
  *H01F 27/28* (2006.01)
  *H01F 27/29* (2006.01)
  *H01F 41/04* (2006.01)

(52) U.S. Cl.
  CPC ......... *H01F 27/2804* (2013.01); *H01F 27/29* (2013.01); *H01F 41/041* (2013.01); *H01F 2027/2809* (2013.01)

(58) Field of Classification Search
  CPC ......... H01F 27/2804; H01F 2027/2809; H01F 17/0013; H01F 17/0006; H01F 5/003; H01F 27/29; H01F 27/292
  (Continued)

(56) References Cited

U.S. PATENT DOCUMENTS 7,663,225 B2 * 2/2010 Kudo .................... H01G 4/012
  156/89.12
8,022,805 B2 * 9/2011 Lee ..................... H01F 17/0006
  336/200

(Continued)

FOREIGN PATENT DOCUMENTS

JP 2009-099698 A 5/2009
JP 2012-182285 A 9/2012
  (Continued)

OTHER PUBLICATIONS

Official Communication issued in International Patent Application No. PCT/JP2018/018092, dated Jul. 31, 2018.

*Primary Examiner* — Tszfung J Chan
(74) *Attorney, Agent, or Firm* — Keating & Bennett, LLP

(57) ABSTRACT

A coil-embedded ceramic substrate includes a plurality of ceramic layers including multi-turn coil patterns provided thereon. At least one ceramic layer of the plurality of ceramic layers includes thereon a multi-turn coil pattern and dummy patterns not electrically connected to the multi-turn coil pattern. The multi-turn coil pattern winds around and extends parallel or substantially parallel to sides of the ceramic layer. The dummy patterns are each parallel or substantially parallel to corresponding ones of the sides of the ceramic layer as an extension of portion of the coil pattern in an extending direction.

19 Claims, 6 Drawing Sheets

(58) Field of Classification Search
 USPC .................................................. 336/200, 232
 See application file for complete search history.

(56) References Cited

U.S. PATENT DOCUMENTS

| | | | | |
|---|---|---|---|---|
| 2007/0228515 | A1* | 10/2007 | Asahi | H01L 23/522 |
| | | | | 257/E21.022 |
| 2011/0241816 | A1* | 10/2011 | Park | H01F 41/34 |
| | | | | 336/200 |
| 2014/0225702 | A1* | 8/2014 | Yazaki | H01F 27/292 |
| | | | | 336/200 |
| 2016/0078998 | A1* | 3/2016 | Park | H01F 17/0013 |
| | | | | 336/200 |
| 2018/0158592 | A1 | 6/2018 | Yazaki | |

FOREIGN PATENT DOCUMENTS

| | | | | |
|---|---|---|---|---|
| JP | 2016-021461 | A | | 2/2016 |
| JP | 2016-171209 | A | | 9/2016 |
| JP | 2017-059749 | A | | 3/2017 |
| KR | 2014084970 | A | * | 7/2014 |
| WO | WO-2015079773 | A1 | * | 6/2015 .......... G02B 27/646 |
| WO | 2017/038505 | A1 | | 3/2017 |

* cited by examiner

COIL-EMBEDDED CERAMIC SUBSTRATE

CROSS REFERENCE TO RELATED APPLICATIONS

This application claims the benefit of priority to Japanese Patent Application No. 2017-110871 filed on Jun. 5, 2017 and is a Continuation Application of PCT Application No. PCT/JP2018/018092 filed on May 10, 2018. The entire contents of each application are hereby incorporated herein by reference.

BACKGROUND OF THE INVENTION

1. Field of the Invention

The present invention relates to a coil-embedded ceramic substrate that includes a plurality of ceramic layers with multi-turn coil patterns provided thereon.

2. Description of the Related Art

Coil-embedded ceramic substrates are known, which have a structure formed by stacking a plurality of ceramic layers with multi-turn coil patterns provided thereon.

International Publication No. 2017/038505 describes such a coil-embedded ceramic substrate, and in particular, FIG. 9 illustrates a plurality of ceramic layers with multi-turn coil patterns provided thereon.

As a method for manufacturing a coil-embedded ceramic substrate such as that described above, a method that can efficiently manufacture a plurality of coil-embedded ceramic substrates is known, in which a motherboard with a size that allows simultaneous manufacture of a plurality of coil-embedded ceramic substrates is made and divided along linear break grooves formed in the motherboard.

FIG. 8 is a plan view illustrating a multi-turn coil pattern 120 provided on a ceramic layer 110 of a conventional coil-embedded ceramic substrate. Since the shape of the multi-turn coil pattern 120 illustrated in FIG. 8 is not symmetrical with respect to a center point C10 of the ceramic layer 110, there may be local variation in the internal stress of the ceramic layer.

Therefore, when the motherboard is divided along the break grooves in the process of manufacturing the coil-embedded ceramic substrate described above, the motherboard may not be linearly divided and the resulting coil-embedded ceramic substrate may be distorted on sides.

SUMMARY OF THE INVENTION

Preferred embodiments of the present invention provide coil-embedded ceramic substrates each including linear sides which are made with high accuracy.

A coil-embedded ceramic substrate according to a preferred embodiment of the present invention includes a plurality of ceramic layers with multi-turn coil patterns provided thereon.

At least one of the plurality of ceramic layers includes thereon a multi-turn coil pattern, and a dummy pattern that is not electrically connected to the multi-turn coil pattern.

The multi-turn coil pattern winds around a center point of the ceramic layer while extending in parallel or substantially in parallel to sides of the ceramic layer.

The dummy pattern is provided parallel or substantially parallel to corresponding ones of the sides of the ceramic layer as an extension of a portion of the multi-turn coil pattern in an extending direction.

The dummy pattern may be disposed at a position symmetrical or substantially symmetrical to a portion of the multi-turn coil pattern, with respect to a line passing through the center point of the ceramic layer and parallel or substantially parallel to predetermined ones of the sides of the ceramic layer.

The dummy pattern may be disposed at a position symmetrical or substantially symmetrical to a portion of an innermost pattern of the multi-turn coil pattern with respect to the center point of the ceramic layer.

When there is an extended pattern extended from an innermost position of the multi-turn coil pattern to the center point of the ceramic layer, the dummy pattern may be disposed at a position symmetrical or substantially symmetrical to the extended pattern with respect to the center point of the ceramic layer.

Of the plurality of ceramic layers with multi-turn coil patterns provided thereon, an outermost ceramic layer in a stacking direction may include the dummy pattern provided thereon.

When two ceramic layers adjacent in a stacking direction are defined as one set, a gap may be defined between two ceramic layers of at least one of a plurality of sets.

As viewed in the stacking direction, the gap may be provided inside an outer edge of the multi-turn coil patterns.

As viewed in the stacking direction, the gap may be provided in at least a portion of a region where the dummy pattern is defined.

The ceramic layers with multi-turn coil patterns provided thereon may be magnetic layers.

According to preferred embodiments of the present invention, at least one of the plurality of ceramic layers includes thereon a multi-turn coil pattern winding around the center point of the ceramic layer while extending parallel or substantially parallel to sides of the ceramic layer, and a dummy pattern. The dummy pattern is parallel or substantially parallel to corresponding ones of the sides of the ceramic layer as an extension of a portion of the multi-turn coil pattern in the extending direction. With this configuration, a pattern including the multi-turn coil pattern and the dummy pattern becomes closer to being symmetrical or substantially symmetrical with respect to the center point of the ceramic layer than with the configuration having no dummy pattern, and this reduces local variation in the internal stress of the ceramic layer. Therefore, when a motherboard including a plurality of coil-embedded ceramic substrates is cut into individual coil-embedded ceramic substrates, the motherboard can be linearly divided along division lines with high accuracy. Thus, coil-embedded ceramic substrates including linear sides and having a high shape accuracy are able to be obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 2A to 2G each illustrate a ceramic layer as viewed from the upper side in the stacking direction.

FIGS. 3A to 3E each illustrate a ceramic layer as viewed from the upper side in the stacking direction, and FIGS. 3F and 3G each illustrate a ceramic layer as viewed from the lower side in the stacking direction.

DETAILED DESCRIPTION OF THE PREFERRED EMBODIMENTS

Features of the present invention will now be described by referring to preferred embodiments of the present invention and the accompanying drawings.

A coil-embedded ceramic substrate according to a preferred embodiment of the present invention preferably includes a plurality of ceramic layers including multi-turn coil patterns provided thereon.

Figure 1A:
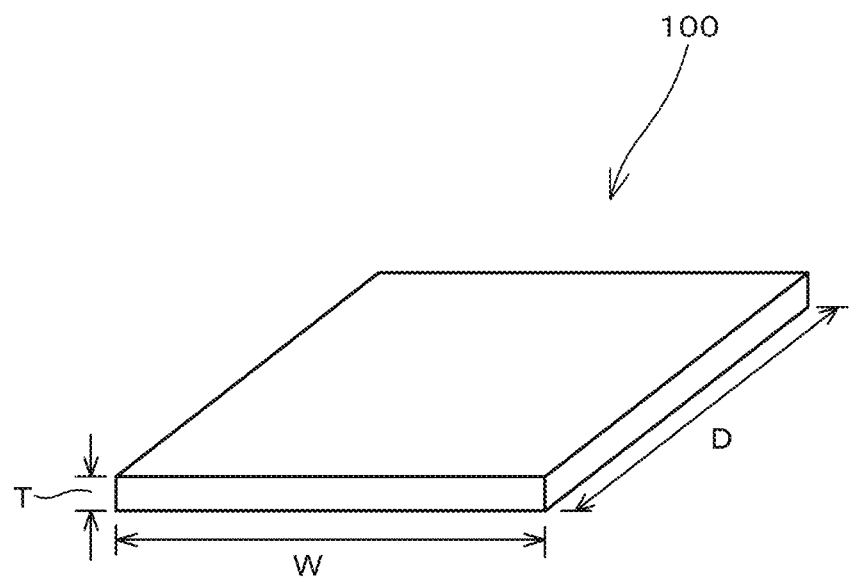
FIG. 1A is a perspective view of a coil-embedded ceramic substrate according to a preferred embodiment of the present invention as viewed from the upper side.
Figure 1B:
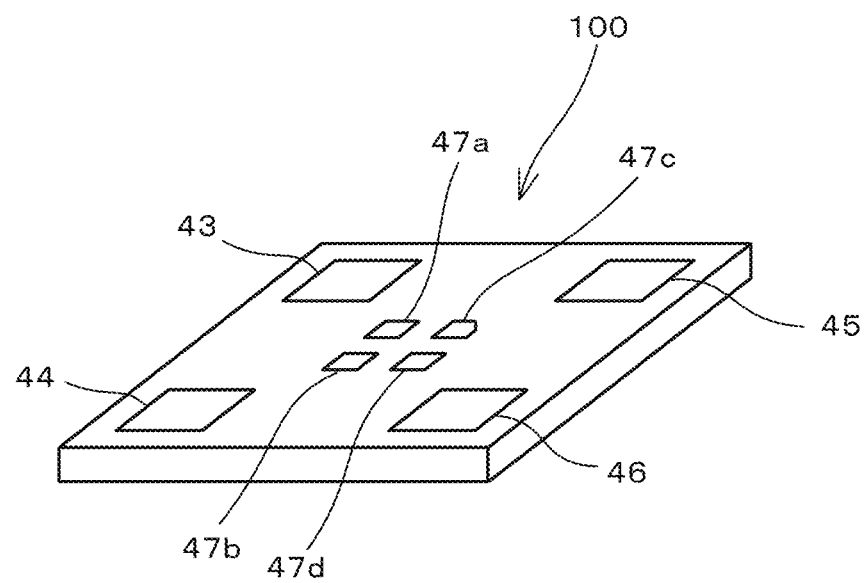
FIG. 1B is a perspective view of the same as viewed from the lower side.

FIG. 1A is a perspective view of a coil-embedded ceramic substrate 100 according to a preferred embodiment of the present invention as viewed from an upper side, and FIG. 1B is a perspective view of the coil-embedded ceramic substrate 100 as viewed from s lower side.

FIGS. 2A through 2G and FIGS. 3A through 3G are plan views illustrating each of ceramic layers 10a to 10n of the coil-embedded ceramic substrate 100. FIGS. 2A to 2G illustrate the ceramic layers 10a to 10g as viewed from the upper side in the stacking direction. FIGS. 3A to 3E illustrate the ceramic layer 10h to 10l as viewed from the upper side in the stacking direction, and FIGS. 3F and 3G illustrate the ceramic layers 10m and 10n as viewed from the lower side in the stacking direction.

As illustrated in FIGS. 1A and 1B, the coil-embedded ceramic substrate 100 is preferably in or substantially in the shape of a rectangular parallelepiped. The outer dimensions of the coil-embedded ceramic substrate 100 are preferably, for example, about 0.5 mm or less in thickness T, and range from about 2.0 mm to about 10.0 mm in width W and depth D. The outer dimensions of the coil-embedded ceramic substrate 100 are not limited to these values.

The coil-embedded ceramic substrate 100 includes a structure defined by stacking the ceramic layers 10a to 10n illustrated in FIGS. 2 and 3 in this order. Note that the ceramic layer 10m is preferably disposed with its surface including a first distribution electrode 41 and a second distribution electrode 42 (described below) provided thereon facing downward in the stacking direction. Similarly, the ceramic layer 10n is preferably disposed with its surface including a first surface electrode 43, a second surface electrode 44, a third surface electrode 45, and a fourth surface electrode 46 (described below) provided thereon facing downward in the stacking direction.

The ceramic layers 10a to 10n are preferably magnetic layers made of a magnetic ceramic material, for example. Of the ceramic layers 10a to 10n, the ceramic layers 10e, 10f, and 10h to 10k include multi-turn coil patterns 20e, 20f, and 20h to 20k, respectively, provided thereon. In the present preferred embodiment, the multi-turn coil patterns 20e, 20f, and 20h to 20k are provided as three-turn coil patterns, for example. In the following description, a multi-turn coil pattern may also be simply referred to as a coil pattern.

A material used to make the coil patterns 20 (20e, 20f, and 20h to 20k) is not particularly limited. For example, a material mainly including silver or copper may preferably be used. The coil patterns 20e, 20f, and 20h to 20k and via hole conductors (described below) define a coil having a winding axis in the stacking direction.

The ceramic layer 10m preferably includes the first distribution electrode 41 and the second distribution electrode 42 provided thereon. The ceramic layer 10n preferably includes the first surface electrode 43, the second surface electrode 44, the third surface electrode 45, and the fourth surface electrode 46 provided thereon.

The ceramic layer 10n preferably includes, near the center thereof, four dummy surface electrodes 47a to 47d that improve the mounting strength. The dummy surface electrodes 47a to 47d are not electrically connected to the first surface electrode 43, the second surface electrode 44, the third surface electrode 45, and the fourth surface electrode 46, and may be optional.

Figure 2A:
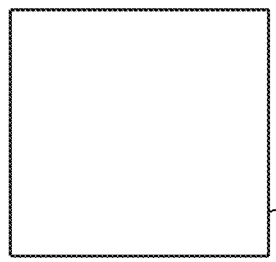
FIGS. 2A to 2G are plan views illustrating ceramic layers of a coil-embedded ceramic substrate according to a preferred embodiment of the present invention.
Figure 2E:
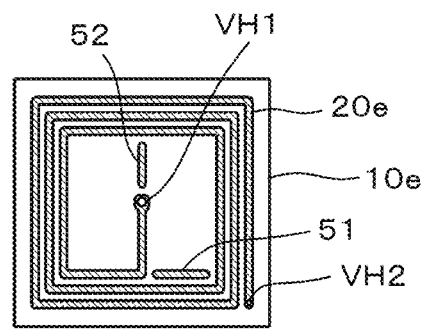
Figure 2B:
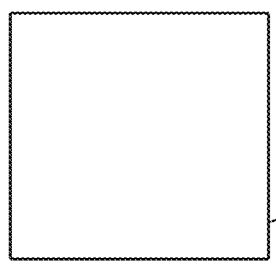
Figure 2F:
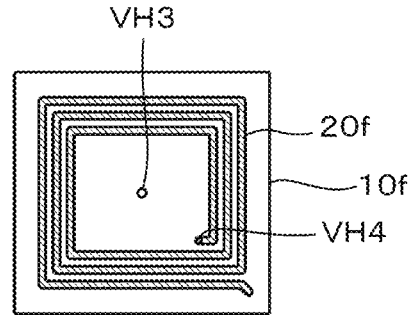
Figure 2C:
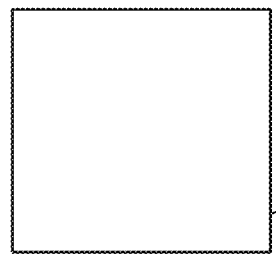
Figure 2G:
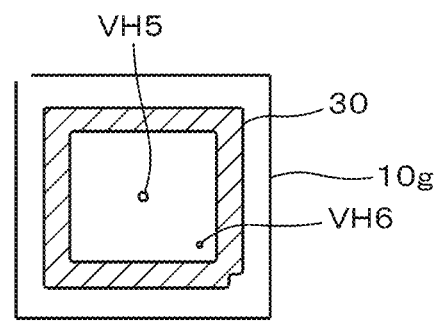
Figure 2D:
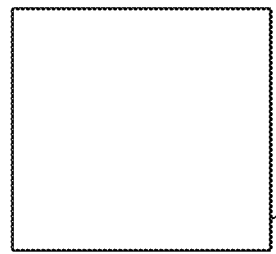

As illustrated in FIG. 2E, the ceramic layer 10e preferably includes via hole conductors VH1 and VH2 defined therein. As illustrated in FIG. 2F, the ceramic layer 10f preferably includes via hole conductors VH3 and VH4 defined therein. As illustrated in FIG. 2G, the ceramic layer 10g preferably includes via hole conductors VH5 and VH6 defined therein.

Figure 3A:
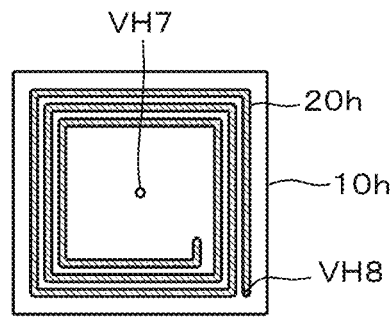
FIGS. 3A to 3G are plan views illustrating ceramic layers of a coil-embedded ceramic substrate according to a preferred embodiment of the present invention.
Figure 3E:
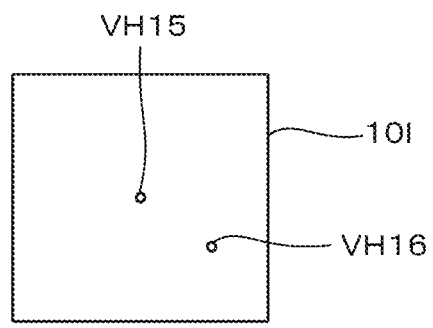
Figure 3B:
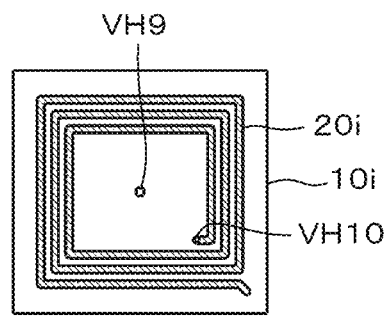
Figure 3F:
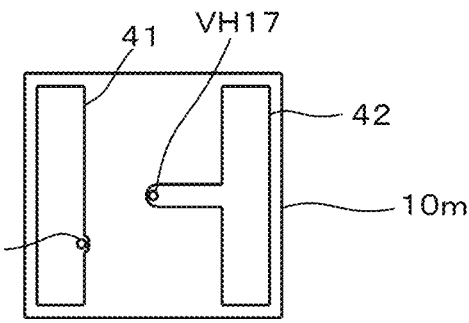
Figure 3C:
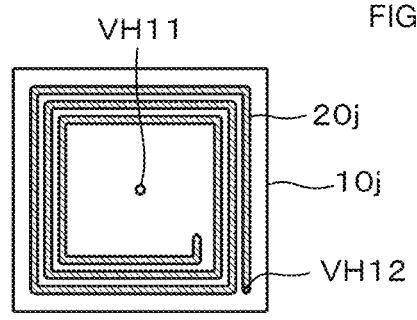
Figure 3G:
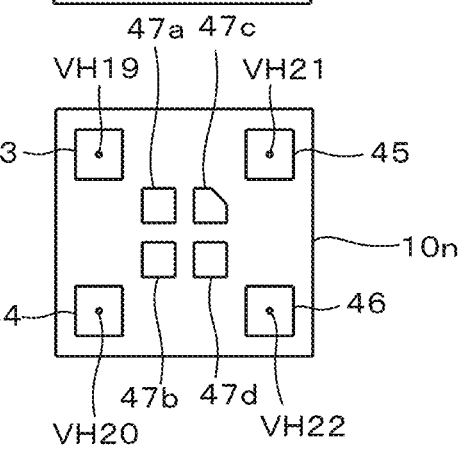
Figure 3D:
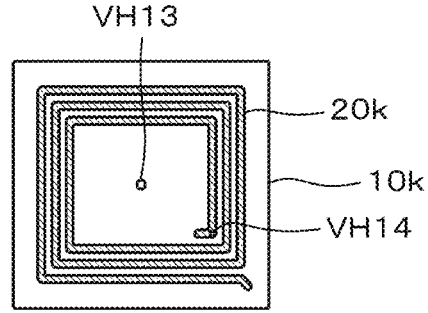

As illustrated in FIG. 3A, the ceramic layer 10h preferably includes via hole conductors VH7 and VH8 defined therein. As illustrated in FIG. 3B, the ceramic layer 10i preferably includes via hole conductors VH9 and VH10 defined therein. As illustrated in FIG. 3C, the ceramic layer 10j preferably includes via hole conductors VH11 and VH12 defined therein. As illustrated in FIG. 3D, the ceramic layer 10k preferably includes via hole conductors VH13 and VH14 defined therein. As illustrated in FIG. 3E, the ceramic layer 10l preferably includes via hole conductors VH15 and VH16 defined therein. As illustrated in FIG. 3F, the ceramic layer 10m preferably includes via hole conductors VH17 and VH18 defined therein. As illustrated in FIG. 3G, the ceramic layer 10n preferably includes via hole conductors VH19, VH20, VH21, and VH22 defined therein.

A material used to make the via hole conductors VH1 to VH22 is not particularly limited. For example, a material mainly including silver or copper may preferably be used.

One end of the coil pattern 20e provided on the ceramic layer 10e, which is the uppermost layer of the ceramic layers including coil patterns provided thereon, or more specifically, one end of the coil pattern 20e located at substantially the center of the ceramic layer 10e, is electrically connected to the second distribution electrode 42, with the via hole conductors VH1, VH3, VH5, VH7, VH9, VH11, VH13, VH15, and VH17 therebetween.

The other end of the coil pattern 20e is preferably electrically connected to the outermost end of the coil pattern 20f on the ceramic layer 10f, with the via hole conductor VH2 therebetween. The other end of the coil pattern 20f on the innermost side is preferably electrically connected to the innermost end of the coil pattern 20h on the ceramic layer 10h, with the via hole conductor VH4 and the via hole conductor VH6 in the ceramic layer 10g therebetween.

The other end of the coil pattern 20h on the outermost side is preferably electrically connected to the outermost end of the coil pattern 20i on the ceramic layer 10i, with the via hole conductor VH8 therebetween. The other end of the coil pattern 20i on the innermost side is preferably electrically connected to the innermost end of the coil pattern 20j on the ceramic layer 10j, with the via hole conductor VH10 therebetween.

The other end of the coil pattern 20j on the outermost side is preferably electrically connected to the outermost end of the coil pattern 20k on the ceramic layer 10k, with the via hole conductor VH12 therebetween. The other end of the coil pattern 20k on the innermost side is preferably electrically connected to the first distribution electrode 41 on the ceramic layer 10m, with the via hole conductor VH14, the via hole conductor VH16 in the ceramic layer 10l, and the via hole conductor VH18 in the ceramic layer 10m therebetween.

The first distribution electrode 41 is preferably electrically connected to the first surface electrode 43, with the via hole conductor VH19 in the ceramic layer 10n therebetween, and is preferably electrically connected to the second surface electrode 44, with the via hole conductor VH20 therebetween. The second distribution electrode 42 is preferably electrically connected to the third surface electrode 45, with the via hole conductor VH21 in the ceramic layer 10n therebetween, and is preferably electrically connected to the fourth surface electrode 46, with the via hole conductor VH22 therebetween.

With the configuration described above, the coil provided in the coil-embedded ceramic substrate 100 is preferably electrically connected at one end thereof to the first surface electrode 43 and the second surface electrode 44, and is electrically connected at the other end thereof to the third surface electrode 45 and the fourth surface electrode 46.

Figure 4:
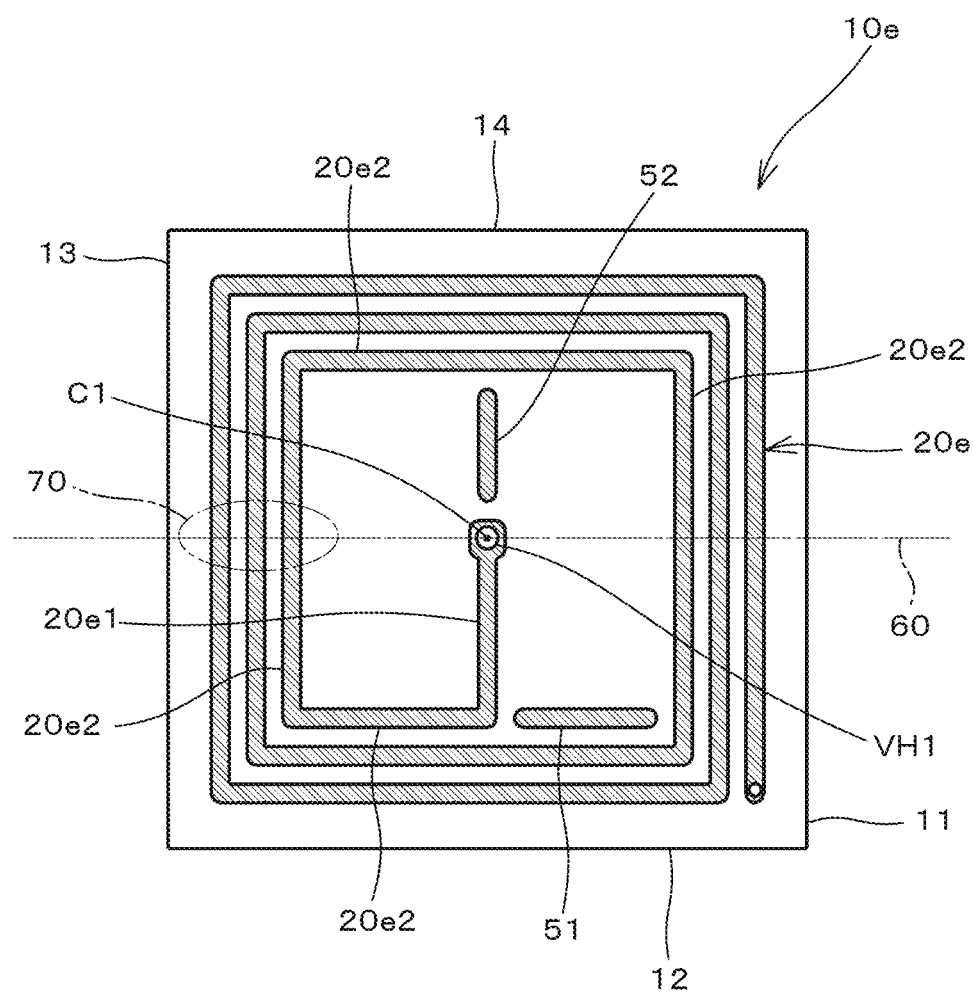
FIG. 4 is an enlarged plan view of the uppermost ceramic layer of a plurality of ceramic layers including coil patterns provided thereon according to a preferred embodiment of the present invention.

FIG. 4 is an enlarged plan view of the ceramic layer 10e illustrated in FIG. 2E. Of the plurality of ceramic layers including coil patterns provided thereon, the ceramic layer 10e is preferably an outermost layer or more specifically, the uppermost layer, in the stacking direction.

As illustrated in FIG. 4, the ceramic layer 10e is preferably rectangular or substantially rectangular in shape and includes a first side 11, a second side 12, a third side 13, and a fourth side 14.

The coil pattern 20e winds around a center point C1 of the ceramic layer 10e while extending parallel or substantially parallel to the first side 11, the second side 12, the third side 13, and the fourth side 14 of the ceramic layer 10e. As described above, the coil pattern 20e is preferably wound with three turns in the present preferred embodiment.

The coil pattern 20e preferably includes an extended pattern 20e1 extended from the innermost position of the winding coil pattern to the center of the ceramic layer 10e. The extended pattern 20e1 is electrically connected to the via hole conductor VH1.

In the coil-embedded ceramic substrate 100 of the present preferred embodiment, the ceramic layer 10e preferably includes two dummy patterns 51 and 52 provided thereon for reasons described below. The dummy patterns 51 and 52 are not electrically connected to the coil pattern 20e or other signal lines.

The dummy patterns 51 and 52 are each provided parallel or substantially parallel to corresponding sides of the ceramic layer 10e, as an extension of a portion of the coil pattern 20e in the extending direction. For example, the dummy pattern 51 may preferably be provided parallel or substantially parallel to the second side 12 and the fourth side 14 as an extension of an innermost pattern 20e2 of the coil pattern 20e, in such a manner as to make up for a missing portion of the winding shape of the innermost pattern 20e2. The dummy pattern 52 is provided parallel or substantially parallel to the first side 11 and the third side 13 as an extension of the extended pattern 20e1 of the coil pattern 20e.

That is, the present preferred embodiment preferably includes the following two configurations where a dummy pattern is provided parallel or substantially parallel to corresponding ones of the sides of the ceramic layer as an extension of a portion of the multi-turn coil pattern in an extending direction according to the present invention. The first configuration is when the innermost pattern 20e2 changes direction in the middle to extend as the extended pattern 20e1 toward the center of the ceramic layer 10e, a dummy pattern (e.g., the dummy pattern 51) is provided at a position where the innermost pattern 20e2 would have been present if it had extended without changing direction. The second configuration is when the extended pattern 20e1 ends at the center point C1 of the ceramic layer 10e, a dummy pattern (e.g., the dummy pattern 52) is provided at a position where the extended pattern 20e1 would have been present if it had extended to the vicinity of the innermost pattern 20e2 without ending at the center point C1 of the ceramic layer 10e illustrated in FIG. 4.

The position of each of the dummy patterns 51 and 52 will be described in more detail below.

The dummy patterns 51 and 52 may also be described as being arranged such that the pattern including the coil pattern 20e and the dummy patterns 51 and 52 is symmetrical or substantially symmetrical with respect to a line 60 passing through the center point C1 of the ceramic layer 10e and parallel or substantially parallel to the second side 12 and the fourth side 14 of the ceramic layer 10e.

This means that with the dummy patterns 51 and 52, the pattern including the coil pattern 20e and the dummy patterns 51 and 52 is closer to being symmetrical with respect to the line 60 than without the dummy patterns 51 and 52. When the dummy patterns 51 and 52 are arranged in this manner, the shape of the pattern including the coil pattern 20e and the dummy patterns 51 and 52 is symmetrical or substantially symmetrical with respect to the center point C1 of the ceramic layer 10e.

The dummy patterns 51 and 52 may also be described as being arranged such that they each are symmetrical or substantially symmetrical to a corresponding portion of the coil pattern 20e, with respect to the line 60 passing through the center point C1 of the ceramic layer 10e and parallel or substantially parallel to the second side 12 and the fourth side 14 of the ceramic layer 10e.

Of the two dummy patterns 51 and 52, the dummy pattern is disposed such that the pattern including the innermost pattern 20e2 of the coil pattern 20e and the dummy pattern 51 is symmetrical or substantially symmetrical with respect to the center point C1 of the ceramic layer 10e.

This means that with the dummy pattern 51, the pattern including the innermost pattern 20e2 of the coil pattern 20e and the dummy pattern 51 is closer to being symmetrical with respect to the center point C1 of the ceramic layer 10e than when without the dummy pattern 51.

Of the two dummy patterns 51 and 52, the dummy pattern is disposed at a position symmetrical or substantially symmetrical to a portion of the innermost pattern 20e2 of the coil pattern 20e with respect to the center point C1 of the ceramic layer 10e.

As illustrated in FIG. 4, the innermost pattern 20e2 of the coil pattern 20e includes patterns adjacent to the first side 11, the second side 12, the third side 13, and the fourth side 14. Of these patterns, the pattern close to the second side 12 is connected continuously to the extended pattern 20e1 extended to the center point C1 of the ceramic layer 10e, and thus includes a length half or substantially half the length of the other patterns close to the first side 11, the third side 13, and the fourth side 14.

The dummy pattern 51 is disposed parallel or substantially parallel to the second side 12 as an extension of the pattern of the innermost pattern 20e2 close to the second side 12. With the dummy pattern 51 disposed in this manner, the pattern including the innermost pattern 20e2 of the coil pattern 20e and the dummy pattern 51 has a shape symmetrical or substantially symmetrical with respect to the center point C1 of the ceramic layer 10e.

As described above, the extended pattern 20e1 is extended from the innermost position of the coil pattern 20e having an annular shape to the center point C1 of the ceramic layer 10e. The dummy pattern 52 is disposed at a position symmetrical or substantially symmetrical to a portion of the extended pattern 20e1 with respect to the center point C1 of the ceramic layer 10e. That is, as an extension of the extended pattern 20e1, the dummy pattern 52 is disposed in a region between the center point C1 of the ceramic layer 10e and the innermost pattern 20e2 of the coil pattern 20e.

The ceramic layer 10g disposed between the ceramic layer 10f and the ceramic layer 10h, each including the coil pattern 20 provided thereon, includes a gap 30 (see FIG. 2G). As viewed in the stacking direction, the gap 30 is provided inside the region where the coil patterns 20 are provided.

Figure 5:
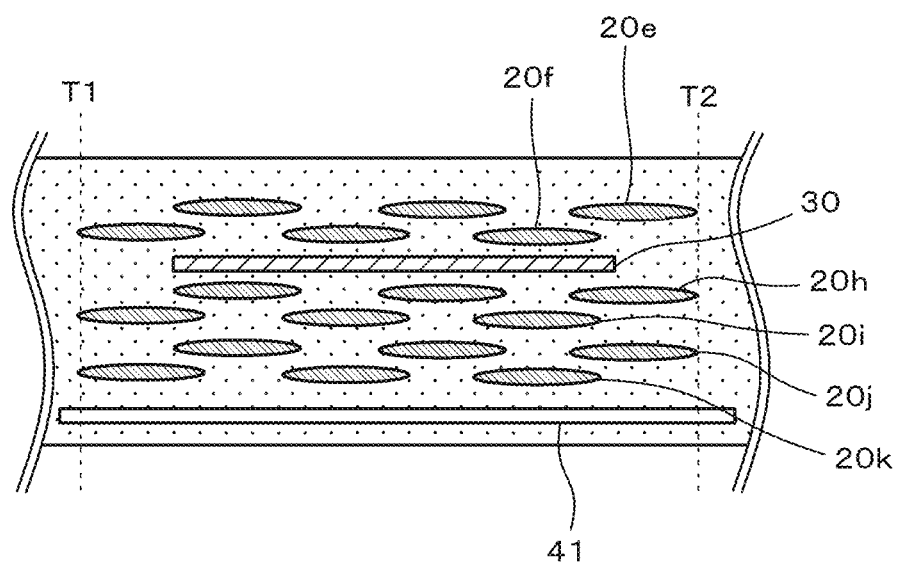
FIG. 5 is a cross-sectional view of the coil-embedded ceramic substrate taken along a line parallel or substantially parallel to a line 60 illustrated in FIG. 4, the cross-sectional view illustrating a region surrounded by a dotted line in FIG. 4.

FIG. 5 is a cross-sectional view of the coil-embedded ceramic substrate 100 taken along a center line or, more specifically, a line parallel or substantially parallel to the line 60 illustrated in FIG. 4. FIG. 5 illustrates a region corresponding to a region 70 surrounded by a dotted line in FIG. 4. As illustrated in FIG. 5, the coil patterns adjacent to each other in the stacking direction are not arranged to completely overlap in the stacking direction, and are offset from each other.

As illustrated in FIG. 5, the gap 30 is preferably disposed inside an outer edge T1 of the coil patterns 20 (20e, 20f, and 20h to 20k) and outside an inner edge T2 of the coil patterns 20, as viewed in the stacking direction.

Of the two dummy patterns 51 and 52, as described above, the dummy pattern 51 is disposed as an extension of the pattern of the innermost pattern 20e2 close to the second side 12. Therefore, the gap 30 is also provided in the region where the dummy pattern 51 is arranged, as viewed in the stacking direction.

The process of manufacturing each of the ceramic layers 10a to 10n involves a firing step. Without the gap 30, stress generated between the ceramic layer and the coil pattern during cooling after the firing, due to a difference in heat shrinkage ratio, may cause stress in the coil-embedded ceramic substrate after the firing, and this may degrade magnetic characteristics, such as magnetic permeability. With the gap 30, however, stress generated between the ceramic layer and the coil pattern is relaxed and this reduces degradation of magnetic characteristics.

In particular, since the gap 30 is provided inside the outer edge of the coil patterns 20 as viewed in the stacking direction, it is possible to reduce the occurrence of cracks caused by thermal shock at the gap end portion during manufacture of the ceramic layers. The coil-embedded ceramic substrate 100 having high reliability is thus obtained.

As viewed in the stacking direction, the gap 30 is provided not only in the region where the coil patterns 20 are provided, but also in the region where the dummy pattern 51 is provided. This reduces stress generated between the dummy pattern and the ceramic layer, and reduces degradation of magnetic characteristics.

The coil-embedded ceramic substrate 100 having the structure and features described above may be manufactured, for example, by the following non-limiting example of a method.

First, ceramic green sheets made of, for example, magnetic ferrite, for forming the ceramic layers 10a to 10h are prepared. The ceramic green sheets are mother sheets having a size that allows simultaneous manufacture of a plurality of coil-embedded ceramic substrates.

Next, holes used in forming via hole conductors are formed, as necessary, in the ceramic green sheets, and the resulting holes are filled with a conductive paste. Also, a conductive paste used in forming the coil patterns 20e, 20f, and 20h to 20k, the dummy patterns 51 and 52, the first distribution electrode 41, the second distribution electrode 42, the first surface electrode 43, the second surface electrode 44, the third surface electrode 45, and the fourth surface electrode 46 is applied in predetermined shapes to principal surfaces of the ceramic green sheets as necessary.

For forming the gap 30, a material to be removed by firing is applied in a predetermined shape to the principal surface of the ceramic green sheet used in forming the ceramic layer 10g. For example, a carbon paste may preferably be used as the material to be removed by firing.

Next, the ceramic green sheets are stacked in a predetermined order and compressed into a single assembly to form an unfired mother multilayer body. Then, break grooves used to divide the mother multilayer body into individual element portions are formed in the unfired mother multilayer body. The element portions are portions that are each made into one coil-embedded ceramic substrate.

Figure 6:
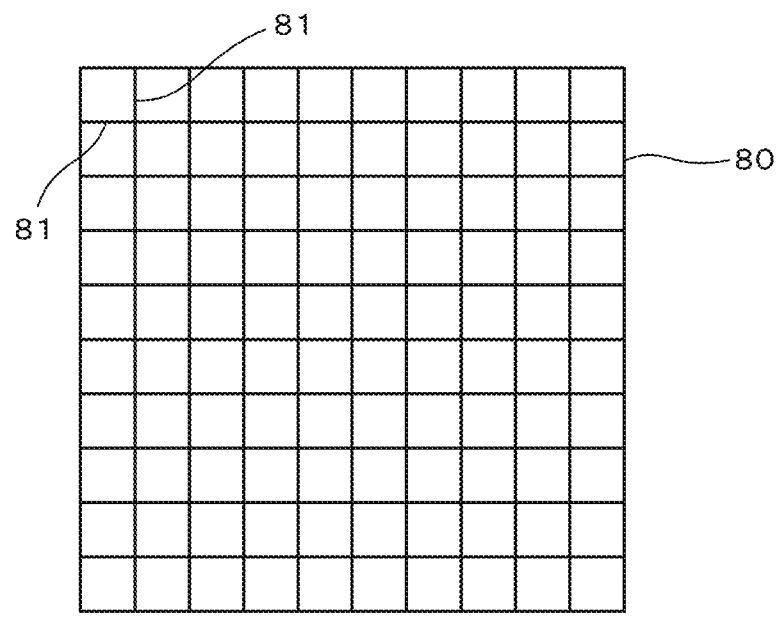
FIG. 6 is a plan view of a motherboard according to a preferred embodiment of the present invention.
Figure 7:
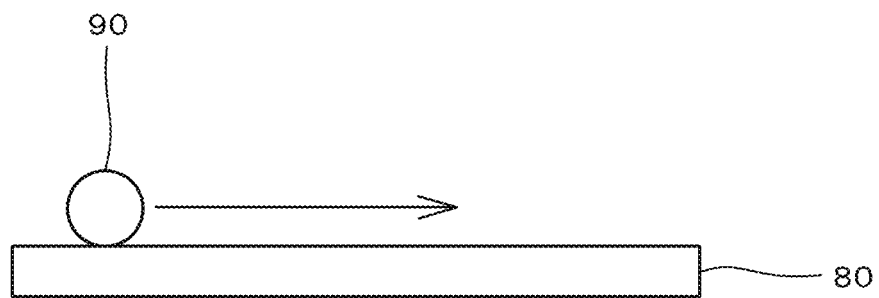
FIG. 7 illustrates how the motherboard is divided using a cutter.
Figure 8:
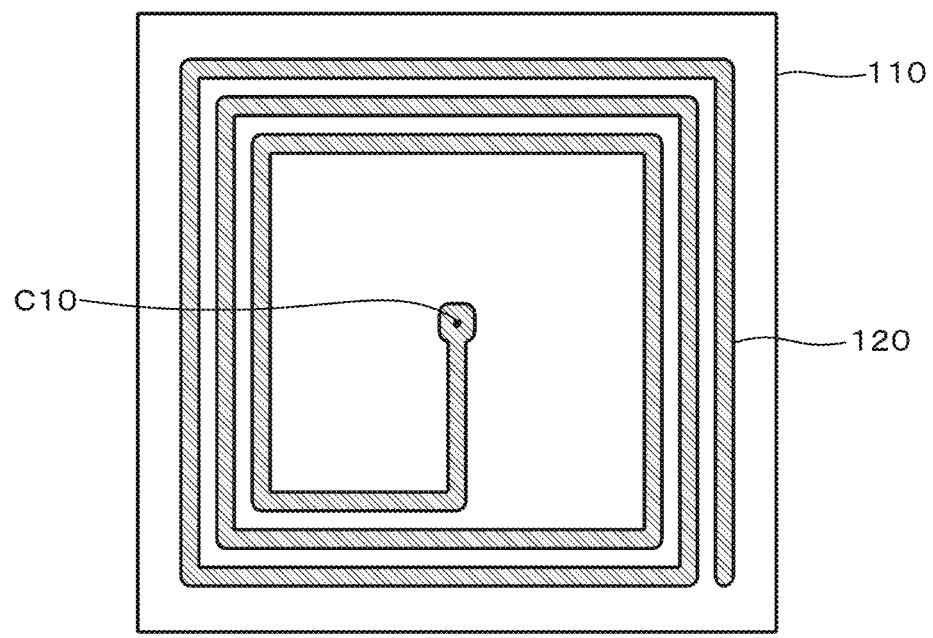
FIG. 8 is a plan view illustrating a multi-turn coil pattern provided on a ceramic layer of a conventional coil-embedded ceramic substrate.

Next, the unfired mother multilayer body is fired at a predetermined profile to obtain a motherboard 80 illustrated in FIG. 6. Finally, the motherboard 80 is divided into a plurality of individual element portions along break grooves 81 formed in the motherboard 80. For example, this is done, as illustrated in FIG. 7, by cutting the motherboard 80 along the break grooves 81 using a cutter 90.

As described above, in the coil-embedded ceramic substrate 100 according to the present preferred embodiment, the dummy patterns 51 and 52 are each formed as an extension of portions of the coil pattern 20e winding around while extending parallel or substantially parallel to each of the sides 11 to 14 of the ceramic layer 10e. In particular, the dummy patterns 51 and 52 are arranged such that the pattern including the coil pattern 20e and the dummy patterns 51 and 52 is symmetrical or substantially symmetrical, with respect to the line 60 passing through the center point C1 of the ceramic layer 10e and parallel or substantially parallel to the second side 12 and the fourth side 14, which are predetermined sides of the ceramic layer 10e. In other words, the dummy patterns 51 and 52 are each disposed at a position symmetrical or substantially symmetrical to a portion of the coil pattern 20e, with respect to the line 60 passing through the center point C1 of the ceramic layer 10e and parallel to the second side 12 and the fourth side 14 of the ceramic layer 10e. This reduces local variation in the internal stress of the ceramic layer 10e. Thus, when the motherboard 80 is divided along the linear break grooves 81 to manufacture a plurality of coil-embedded ceramic substrates 100 at the same time, the motherboard 80 can be linearly divided accurately without distortion.

In particular, when the thickness T of the substrate is as small as about 0.5 mm or less, it may be difficult to linearly divide the motherboard 80 along the break grooves 81. In the case of the coil-embedded ceramic substrate 100 of the present preferred embodiment, however, the motherboard 80 can be linearly divided with accuracy.

As described above, the dummy pattern 51 is preferably disposed such that the pattern including the innermost pattern 20e2 of the coil pattern 20e and the dummy pattern 51 is symmetrical or substantially symmetrical with respect the center point C1 of the ceramic layer 10e. Since this reduces local variation in the internal stress of the ceramic layer 10e, the motherboard 80 can be linearly divided along the linear break grooves 81 accurately without distortion.

With respect to the center point C1 of the ceramic layer 10e, the dummy pattern 52 is disposed at a position symmetrical or substantially symmetrical to the extended pattern 20e1 extended from the innermost position of the coil pattern 20e to the center point C1 of the ceramic layer 10e. Since this reduces local variation in the internal stress of the ceramic layer 10e, the motherboard 80 can be linearly divided along the linear break grooves 81 accurately without distortion.

Of the plurality of ceramic layers 10e, 10f, and 10h to 10k including the coil patterns 20 formed thereon, the outermost ceramic layer 10e in the stacking direction includes the dummy patterns 51 and 52 thereon. That is, the dummy patterns 51 and 52 are formed on the ceramic layer 10e including the coil pattern 20 whose shape significantly influences whether the motherboard 80 can be linearly divided along the linear break grooves 81. It is thus possible to accurately divide the motherboard 80.

The present invention is not limited to the preferred embodiments described above, and various applications and modifications can be made within the scope of the present invention.

For example, of the plurality of ceramic layers including coil patterns provided thereon, the outermost ceramic layer in the stacking direction includes the dummy patterns provided thereon in the description above. However, any of the ceramic layers including coil patterns provided thereon may include the dummy patterns provided thereon. More than one ceramic layer may include coil and dummy patterns provided thereon.

The position of the gap 30 is not limited to the layer between the ceramic layer 10f and the ceramic layer 10h, and may be any layer between two ceramic layers adjacent in the stacking direction. When two ceramic layers 10 adjacent in the stacking direction are defined as one set, the gap 30 may be provided between two ceramic layers of each of a plurality of sets.

The shape of the multi-turn coil patterns provided on the ceramic layers is not limited to that illustrated in FIG. 4. That is, the multi-turn coil patterns are not limited to three-turn coil patterns.

The number of ceramic layers defining the coil-embedded ceramic substrate and the number of ceramic layers with multi-turn coil patterns provided thereon may both be any suitable numbers.

The plurality of ceramic layers defining the coil-embedded ceramic substrate are not limited to magnetic layers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil-embedded ceramic substrate, comprising:
a plurality of ceramic layers including multi-turn coil patterns provided thereon; wherein
at least one of the plurality of ceramic layers includes thereon a multi-turn coil pattern, and a dummy pattern that is not electrically connected to the multi-turn coil pattern;
the multi-turn coil pattern winds around a center point of one of the plurality of ceramic layers while extending parallel or substantially parallel to sides of the one of the plurality of ceramic layers;
the dummy pattern is parallel or substantially parallel to corresponding ones of the sides of the one of the plurality of ceramic layers; and an extended pattern extends from an innermost position of the multi-turn coil pattern to the center point of the one of the plurality of ceramic layers, and the dummy pattern is disposed at a position substantially symmetrical to the extended pattern with respect to the center point of the one of the plurality of ceramic layers.

2. The coil-embedded ceramic substrate according to claim 1, wherein the dummy pattern is disposed at a position substantially symmetrical to a portion of the multi-turn coil pattern, with respect to a line passing through the center point of the one of the plurality of ceramic layers and parallel or substantially parallel to predetermined ones of the sides of the one of the plurality of ceramic layers.

3. The coil-embedded ceramic substrate according to claim 1, wherein the dummy pattern is disposed at a position substantially symmetrical to a portion of an innermost pattern of the multi-turn coil pattern with respect to the center point of the one of the plurality of ceramic layers.

4. The coil-embedded ceramic substrate according to claim 1, wherein, of the plurality of ceramic layers including multi-turn coil patterns provided thereon, an outermost ceramic layer in a stacking direction includes the dummy pattern provided thereon.

5. The coil-embedded ceramic substrate according to claim 1, wherein
when two of the plurality of ceramic layers adjacent in a stacking direction are defined as one set, a gap is provided between the two of the plurality of ceramic layers of at least one of a plurality of sets; and
as viewed in the stacking direction, the gap is provided inside an outer edge of the multi-turn coil patterns.

6. The coil-embedded ceramic substrate according to claim 5, wherein, as viewed in the stacking direction, the gap is provided in at least a portion of a region where the dummy pattern is provided.

7. The coil-embedded ceramic substrate according to claim 1, wherein ones of the plurality of ceramic layers included multi-turn coil patterns provided thereon are magnetic layers.

8. The coil-embedded ceramic substrate according to claim 1, wherein the coil-embedded ceramic substrate is in or substantially in the shape of a rectangular parallelepiped, has a thickness of about 0.5 mm or less, has a width in a range from about 2.0 mm to about 10.0 mm, and has a depth in a range from about 2.0 mm to about 10.0 mm.

9. The coil-embedded ceramic substrate according to claim 4, wherein the outermost ceramic layer in a stacking direction includes a plurality of dummy surface electrodes.

10. The coil-embedded ceramic substrate according to claim 9, wherein the outermost ceramic layer in a stacking direction further includes a plurality of surface electrodes which are not electrically connected to the plurality of dummy surface electrodes.

11. The coil-embedded ceramic substrate according to claim 1, wherein multiple ones of the plurality of ceramic layers include thereon respective ones of a plurality of the multi-turn coil patterns, the plurality of multi-turn coil patterns being connected through via hole conductors extending through the plurality of ceramic layers.

12. The coil-embedded ceramic substrate according to claim 1, wherein the multi-turn coil pattern is made of a material mainly including silver or copper.

13. The coil-embedded ceramic substrate according to claim 1, wherein the extended pattern is directly electrically connected to a via hole conductor which is connected to a distribution electrode.

14. The coil-embedded ceramic substrate according to claim 11, wherein each of the plurality of multi-turn coil patterns is wound with three turns.

15. The coil-embedded ceramic substrate according to claim 1, wherein the dummy pattern includes two dummy patterns that are provided adjacent to the extended pattern on the one of the plurality of the ceramic layers.

16. The coil-embedded ceramic substrate according to claim 15, wherein the two dummy patterns are provided perpendicular or substantially perpendicular to one another, and the two dummy patterns are provided parallel or substantially parallel to respective sides of the one of the plurality of ceramic layers.

17. The coil-embedded ceramic substrate according to claim 11, wherein the plurality of multi-turn coil patterns are offset from one another in a stacking direction of the plurality of ceramic layers.

18. The coil-embedded ceramic substrate according to claim 1, wherein multiple ones of the plurality of ceramic layers including the multi-turn coil patterns provided thereon each include the dummy pattern provided thereon.

19. The coil-embedded ceramic substrate according to claim 13, wherein the via hole conductor is made of a material mainly including silver or copper.

* * * * *